(12) United States Patent
Huisman et al.

(10) Patent No.: US 11,668,661 B2
(45) Date of Patent: Jun. 6, 2023

(54) INSPECTION TOOL AND INSPECTION METHOD

(71) Applicant: ASML Netherlands B.V., Veldhoven (NL)

(72) Inventors: Thomas Jarik Huisman, Eindhoven (NL); Sander Frederik Wuister, Eindhoven (NL); Hermanus Adrianus Dillen, Maarheeze (NL); Dorothea Maria Christina Oorschot, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 446 days.

(21) Appl. No.: 17/019,149

(22) Filed: Sep. 11, 2020

(65) Prior Publication Data
US 2021/0003521 A1 Jan. 7, 2021

Related U.S. Application Data

(63) Continuation of application No. PCT/EP2019/054669, filed on Feb. 26, 2019.

(30) Foreign Application Priority Data

Mar. 13, 2018 (EP) .................................... 18161533

(51) Int. Cl.
*G01N 23/2251* (2018.01)
*G06T 7/62* (2017.01)
(Continued)

(52) U.S. Cl.
CPC .......... *G01N 23/2251* (2013.01); *G03F 1/84* (2013.01); *G03F 7/7085* (2013.01);
(Continued)

(58) Field of Classification Search
CPC .......... G01N 23/2251; G01N 2223/07; G01N 2223/401; G01N 2223/507; G06T 7/62;
(Continued)

(56) References Cited

U.S. PATENT DOCUMENTS 6,363,167 B1 3/2002 Miyano et al.
6,366,688 B1 4/2002 Jun et al.
(Continued)

FOREIGN PATENT DOCUMENTS

| CN | 103210336 A | 7/2013 |
|---|---|---|
| JP | 6068624 B2 | 1/2017 |
| TW | 201818064 A | 5/2018 |

OTHER PUBLICATIONS

First Office Action from the China Patent Office issued in related Chinese Patent Application No. 2019800188401; dated Aug. 3, 2022 (12 pgs.).
Notification of Reason(s) for Refusal from the Korean Patent Office issued in related Korean Patent Application No. 10-2020-7026296; dated Aug. 15, 2022 (10 pgs.).
(Continued)

*Primary Examiner* — Nicole M Ippolito
*Assistant Examiner* — Hanway Chang
(74) *Attorney, Agent, or Firm* — Finnegan, Henderson, Farabow, Garrett & Dunner, LLP

(57) ABSTRACT

Apparatuses, systems, and methods for inspecting a semiconductor sample are disclosed. In some embodiments, the sample may comprise a structure having a plurality of openings in a top layer of the structure. In some embodiments, the method may comprise generating an image of the structure using a SEM; inspecting an opening of the plurality of openings by determining a dimension of the opening based on the image and determining an open-state of the opening, based on a contrast of the image; and determining
(Continued)

a quality of the opening based on both the determined dimension and the determined open-state of the opening.

10 Claims, 9 Drawing Sheets

(51) Int. Cl.
    *G03F 1/84*     (2012.01)
    *G03F 7/20*     (2006.01)
    *G06T 7/00*     (2017.01)
    *G03F 7/00*     (2006.01)

(52) U.S. Cl.
    CPC ........ *G03F 7/70608* (2013.01); *G06T 7/0004* (2013.01); *G06T 7/62* (2017.01); *G01N 2223/07* (2013.01); *G01N 2223/401* (2013.01); *G01N 2223/507* (2013.01); *G06T 2207/10061* (2013.01); *G06T 2207/30148* (2013.01)

(58) Field of Classification Search
    CPC ......... G06T 7/0004; G06T 2207/10061; G06T 2207/30148; G03F 1/84; G03F 7/70608; G03F 7/7085

See application file for complete search history.

(56) References Cited

U.S. PATENT DOCUMENTS

| | | |
|---|---|---|
| 6,414,308 B1 | 7/2002 | Bowley, Jr. |
| 2013/0223723 A1 | 8/2013 | Shibahara et al. |
| 2015/0243568 A1 | 8/2015 | Fischer et al. |
| 2016/0071688 A1 | 3/2016 | Goto et al. |
| 2017/0194125 A1 | 7/2017 | Kris et al. |
| 2018/0047148 A1 | 2/2018 | Xu et al. |

OTHER PUBLICATIONS

International Search Report and Written Opinion issued by the International Searching Authority in related PCT Application No. PCT/EP2019/054669, dated May 28, 2019 (9 pgs.).

The Extended European Search Report issued by the European Patent Office in related European Application No. 18161533.7, dated Oct. 8, 2018 (7 pgs.).

Taiwanese Office Action issued in related ROC (Taiwan) Patent Application No. 108107538, dated Mar. 31, 2020 (13 pgs.).

INSPECTION TOOL AND INSPECTION METHOD

CROSS-REFERENCE TO RELATED APPLICATIONS

This application claims priority of International Application PCT/EP2019/054669, which was filed on Feb. 26, 2019, which claims priority of EP application 18161533.7, which was filed on Mar. 13, 2018, both of which are incorporated herein by reference in their entireties.

FIELD

The present disclosure relates to a scanning electron microscope (SEM) based inspection tool, an inspection method and a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (e.g., a resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

The radiation beam as typically applied in lithographic apparatuses may be, for example, a deep ultraviolet (DUV) radiation beam (e.g., having a wavelength of 248 nm or 193 nm) or an extreme ultraviolet (EUV) radiation beam (e.g., having a wavelength of 11 nm or 13.5 nm).

The manufacturing of an integrated circuit may typically require the stacking of a plurality of layers, whereby the layers need to be accurately aligned. Without such an alignment, a required connection between layers may be flawed, resulting in a malfunctioning of the integrated circuit.

Typically, the bottom layer or layers of the integrated circuit will contain the smallest structures, such as transistors or components thereof. The structures of subsequent layers are typically larger and enable connections of the structures in the bottom layers to the outside world. In view of this, an alignment of two layers will be the most challenging in the bottom portion of the integrated circuit.

In order to ensure that a circuit or a circuit layer is properly patterned, substrates are often subjected to inspection, using inspection tools such as electron beam (e-beam) inspection tools. For example, such tools may be applied to assess whether or not certain process steps, such as steps performed by a lithographic apparatus, are executed as expected.

It would be desirable to improve the performance of e-beam inspection tools such as high-resolution SEMs as currently available.

SUMMARY

It is desirable to improve the performance of e-beam inspection tools, in particular, it would be desirable to obtain a more detailed feedback on the performance of lithographical apparatuses or processes, based on measurements performed by inspection tools such as e-beam inspection tools.

In order to address these concerns, according to some embodiments of the present disclosure, there is provided a method of inspecting a semiconductor sample, the sample comprising a structure having a plurality of openings in a top layer of the structure, the method comprising generating an image of the structure using a SEM;

inspecting an opening or the plurality of openings by determining a dimension of the opening or the plurality of openings based on the image and determining an open-state of the opening or the plurality of openings, based on a contrast of the image; and determining a quality of the opening or the plurality of openings based on both the determined dimension and the determined open-state.

According to some embodiments of the present disclosure, there is provided a method of inspecting a semiconductor sample, the sample comprising a structure having a plurality of openings in a top layer of the structure, the method comprising generating an image of the structure; inspecting an opening or the plurality of openings by determining a dimension of the opening or the plurality of openings based on the image and determining a contrast between the top layer and the opening or between the top layer and the plurality of openings; and determining a quality of the opening or the plurality of openings based on both the determined dimension and the determined contrast.

According to some embodiments of the disclosure, there is provided an inspection tool comprising an object table configured to hold a sample, the sample comprising a structure having a plurality of openings in a top layer of the structure; an e-beam source configured to generate an e-beam; a beam manipulator configured to direct the electron beam onto the sample; a detector configured to detect a response signal of the sample caused by interaction of the electron beam with the sample; a processing unit configured to receive the response signal from the detector, generate an image of the structure based on the response signal, and inspect an opening of the plurality of openings by determining a dimension of the opening based on the image; determining an open-state of the opening, based on a contrast of the image; and determining a quality of the opening based on both the determined dimension and the determined open-state of the opening.

BRIEF DESCRIPTION OF THE DRAWINGS

Some embodiments of the disclosure will now be described, by way of example only, with reference to the accompanying schematic drawings in which corresponding reference symbols indicate corresponding parts, and in which.

DETAILED DESCRIPTION

Figure 1:
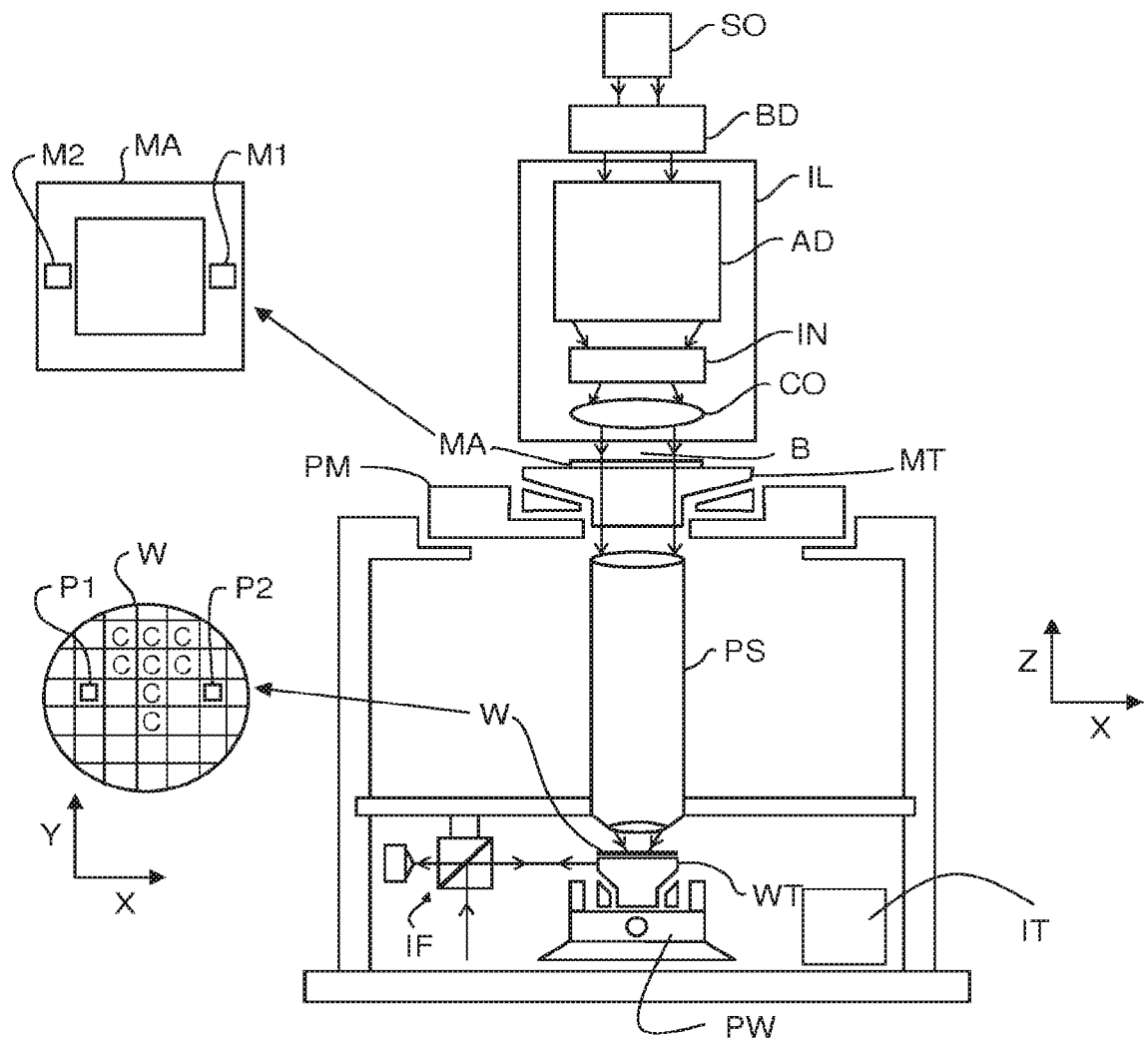
FIG. 1 depicts a lithographic apparatus according to some embodiments of the disclosure.

FIG. 1 schematically depicts a lithographic apparatus according to some embodiments of the disclosure. The apparatus includes an illumination system (illuminator) IL configured to condition a radiation beam B (e.g., ultraviolet radiation or any other suitable radiation), a mask support structure (e.g., a mask table) MT constructed to support a patterning device (e.g., a mask) MA and connected to a first positioning device PM configured to accurately position the patterning device in accordance with certain parameters. The apparatus also includes a substrate table (e.g., a wafer table) WT or "substrate support" constructed to hold a substrate (e.g., a resist-coated wafer) W and connected to a second positioning device PW configured to accurately position the substrate in accordance with certain parameters. The apparatus further includes a projection system (e.g., a refractive projection lens system) PS configured to project a pattern imparted to the radiation beam B by patterning device MA onto a target portion C (e.g., including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports (e.g., bears the weight of) the patterning device. It may hold the patterning device in a manner that depends on the orientation of the patterning device, the design of the lithographic apparatus, and other conditions, such as, for example, whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein may be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example, if the pattern includes phase-shifting features or so-called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable liquid crystal display (LCD) panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors may impart a pattern in a radiation beam which may be reflected by the mirror matrix.

The term "projection system" used herein may be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus may be of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (e.g., dual stage) or more substrate tables or "substrate supports" (e.g., and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index (e.g., water) so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid may be located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In some embodiments, the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B may be incident on the patterning device (e.g., mask MA), which may be held on the mask support structure (e.g., mask table MT), and may be patterned by the patterning device. Having traversed the mask MA, the radiation beam B may pass through the projection system PS, which may focus the beam onto a target portion C of the substrate W. With the aid of the second positioning device PW and position sensor IF (e.g., an interferometric device, linear encoder or capacitive sensor), the substrate table WT can be moved accurately (e.g., so as to position different target portions C in the path of the radiation beam B). Similarly, the first positioning device PM and another position sensor (which is not explicitly depicted in FIG. 1) can be used to accurately position the mask MA with respect to the path of the radiation beam B (e.g., after mechanical retrieval from a mask library, or during a scan). In general, movement of the mask table MT may be realized with the aid of a long-stroke module (e.g., coarse positioning) and a short-stroke module (e.g., fine positioning), which may form part of the first positioning device PM. Similarly, movement of the substrate table WT or "substrate support" may be realized using a long-stroke module and a short-stroke module, which form part of the second positioning device PW. In the case of a stepper (as opposed to a scanner), the mask table MT may be connected to a short-stroke actuator only or may be fixed. Mask MA and substrate W may be aligned using mask alignment marks M1, M2 and substrate alignment marks P1, P2. Although the substrate alignment marks as illustrated may occupy dedicated target portions, they may be located in spaces between target portions (e.g., known as scribe-lane alignment marks). Similarly, in situations in which more than one die is provided on the mask MA, the mask alignment marks may be located between the dies.

The depicted apparatus may be used in at least one of the following modes:

1. In step mode, the mask table MT or "mask support" and the substrate table WT or "substrate support" may be kept essentially stationary, while an entire pattern imparted to the radiation beam may be projected onto a target portion C at one time (e.g., a single static exposure). The substrate table WT or "substrate support" may then shifted in the X and/or Y direction so that a different target portion C can be exposed. In step mode, the maximum size of the exposure field may limit the size of the target portion C imaged in a single static exposure.

2. In scan mode, the mask table MT or "mask support" and the substrate table WT or "substrate support" may be scanned synchronously while a pattern imparted to the radiation beam may projected onto a target portion C (e.g., a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field may limit the width (e.g., in the non-scanning direction) of the target portion in a single dynamic exposure, whereas the length of the scanning motion may determine the height e.g., (in the scanning direction) of the target portion.

3. In another mode, the mask table MT or "mask support" may be kept essentially stationary holding a programmable patterning device, and the substrate table WT or "substrate support" may be moved or scanned while a pattern imparted to the radiation beam may be projected onto a target portion C. In this mode, generally a pulsed radiation source may be employed and the programmable patterning device may be updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In some embodiments, the lithographic apparatus further comprises an inspection tool IT according to the disclosure. Such an inspection tool IT may, for example, enable to determine a characteristic of a structure, in particular a buried structure that is present on or in an area of interest of a substrate W that is processed by the lithographic apparatus. In some embodiments, as will be discussed in more detail below, the inspection tool may comprise an electron beam source for inspecting the substrate.

In some embodiments, the second positioning device PW may be configured to position the substrate W in the operating range of the inspection tool IT. In some embodiments, the inspection tool IT may, for example, be configured to determine a characteristic of the mentioned structure (e.g., an electric characteristic, a material characteristic and/or a geometric characteristic). In some embodiments, this information may subsequently be provided to a control unit of the lithographic apparatus and used during the exposure process (e.g., by controlling one or more of the illumination system, the projection system, or one of the positioning devices) based on the information.

In some embodiments, the lithographic apparatus may be configured to apply DUV radiation for the radiation beam. In such cases, the patterning device MA may be a transmissive patterning device and the projection system PS may comprise one or more lenses.

Alternatively, the lithographic apparatus according to the present disclosure may be configured to apply EUV radiation for the radiation beam. In such cases, the patterning device MA may be a reflective patterning device and the projection system PS may comprise one or more mirrors. In some embodiments, the apparatus may comprise one or more vacuum chambers for housing the illumination system IL and/or the projection system PS.

In accordance with some embodiments of the present disclosure, the lithographic apparatus may comprise an inspection tool according to the present disclosure, in order to perform an inline or offline inspection of a substrate that is to be processed or has been processed.

Figure 2:
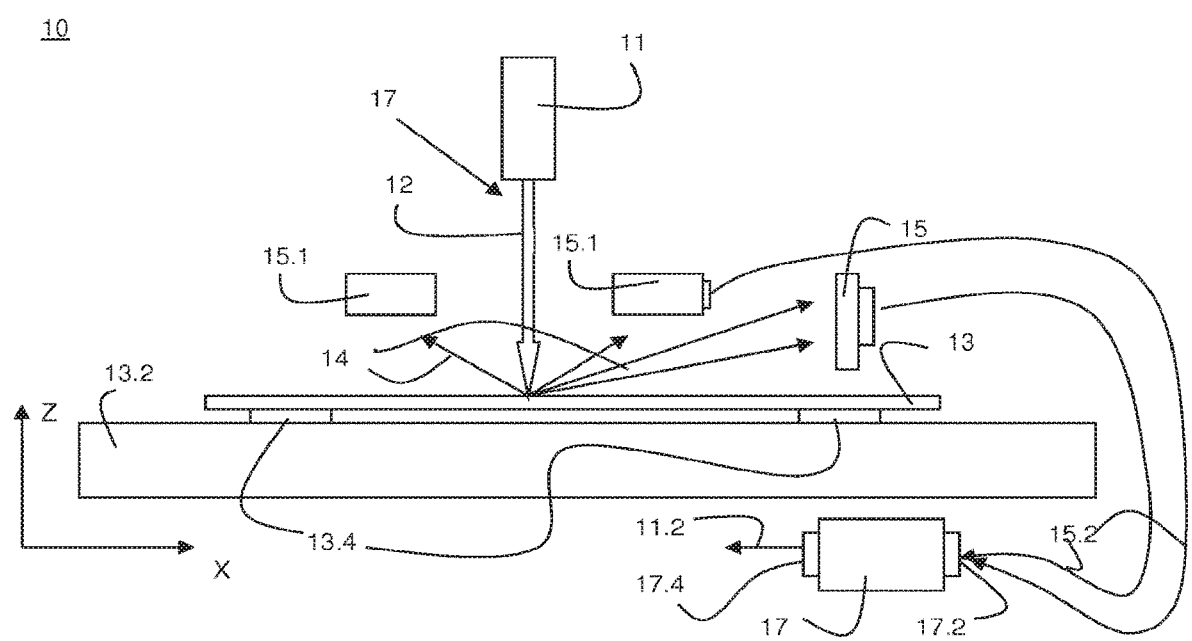
FIG. 2 depicts an inspection tool according to some embodiments of the disclosure.

According to some embodiments of the disclosure, there is provided an inspection tool configured to inspect an object such as a semiconductor substrate. FIG. 2 schematically shows some embodiments of such an inspection tool 10. In accordance with some embodiments the present disclosure, the inspection tool 10 comprises an electron beam source 11, further on also referred to as an e-beam source 11. Such an e-beam source 11 may be known in general, and may be applied in the present disclosure to project an electron beam 12 onto an area of an object 13 (e.g., a substrate). In some embodiments, the object 13 is mounted to an object table 13.2 by means of a clamping mechanism 13.4 (e.g., a vacuum clamp or an electrostatic clamp). The area of the object onto which the e-beam is projected may also be referred to as sample. Such an e-beam source 11 may, for example, be used to generate an electron beam 12 having an energy ranging from 0.2 keV to 100 keV. An e-beam source 11 may typically have one or more lenses for focusing the electron beam 12 onto a spot of about 0.4 to 5 nm in diameter. In some embodiments, the e-beam source 11 may further comprise one or more scanning coils or deflector plates which may deflect the electron beam 12. By doing so, the electron beam 12 may e.g. be deflected along an X-axis and an Y-axis (perpendicular to the X-axis and the Z-axis), the XY-plane being parallel to a surface of the object, such that an area of the object can be scanned.

In some embodiments of the present disclosure, the electron beam source is configured to project a plurality of electron beams onto a respective plurality of sub-areas of the area of interest. By doing so, the area of interest that can be examined or inspected per unit of time may be enlarged. Further, in some embodiments of the present disclosure, the electron beam source may be configured to generate electron beams having a different energy level. As will be explained in more detail below, depending on the applied energy level for the e-beam or beams, different portions or a structure (e.g., a buried structure) may be examined.

When such an e-beam 12 impinges on the surface, interactions on the surface and interactions with the material below the surface may occur, resulting in the exposed surface emitting both radiation and electrons. Typically, when an electron beam 12 interacts with a sample, the electrons constituting the beam may lose energy through scattering and absorption, within a teardrop-shaped volume, known as the interaction volume. The energy exchange between the electron beam and the sample may result in a combination of an emission of secondary electrons by inelastic scattering, an emission of electrons that are reflected or back-scattered out of the interaction volume by elastic scattering interactions with the sample, X-ray emission, and an emission of electromagnetic radiation, e.g. in a range from deep UV to IR. The latter emission of electromagnetic radiation is generally referred to as cathodoluminescent light or CL-light.

In some embodiments of the present disclosure, the inspection tool 10 may comprise a detector 15 for detection of secondary electrons and a detector 15.1 for back-scattering electrons as emitted by a sample. In FIG. 2, the arrows 14 are indicative of the emitted secondary or back-scattering electrons.

In some embodiments, the inspection tool further comprises a control unit 17 or processing unit (e.g., comprising a microprocessor, computer or the like, for processing the emitted secondary or back-scattering electrons as detected by the detectors 15 and 15.1).

In some embodiments, the control unit 17 may comprise an input terminal 17.2 for receiving signals 15.2 from the detectors 15, 15.1, the signals 15.2 representing the detected emitted secondary or back-scattering electrons.

In some embodiments, the control unit may further have an output terminal 17.4 for outputting a control signal 11.2 for controlling the e-beam source 11. In some embodiments, the control unit 17 may control the e-beam source 11 to project an e-beam 12 onto an area of interest of the object to be inspected, e.g. a semiconductor substrate.

In some embodiments, the control unit 17 may be configured to control the e-beam source 11 to scan the area of interest.

During such scanning of an area of interest of an object, the detector may receive secondary or back-scattering electrons 14 from different portions of the area of interest. As an example, the applied e-beam may e.g. have a cross-section of 1-4 nm in diameter, while the area of interest is 100 nm×100 nm. As such, when the area of interest has been scanned, a response to the e-beam across the area of interest may have been captured by detectors 15, 15.1, where the detected signal is comprised of detected electrons per illuminated pixel. The pixel size may be, for example, smaller or larger than the cross-section of the e-beam.

Figures 3A, 3B:
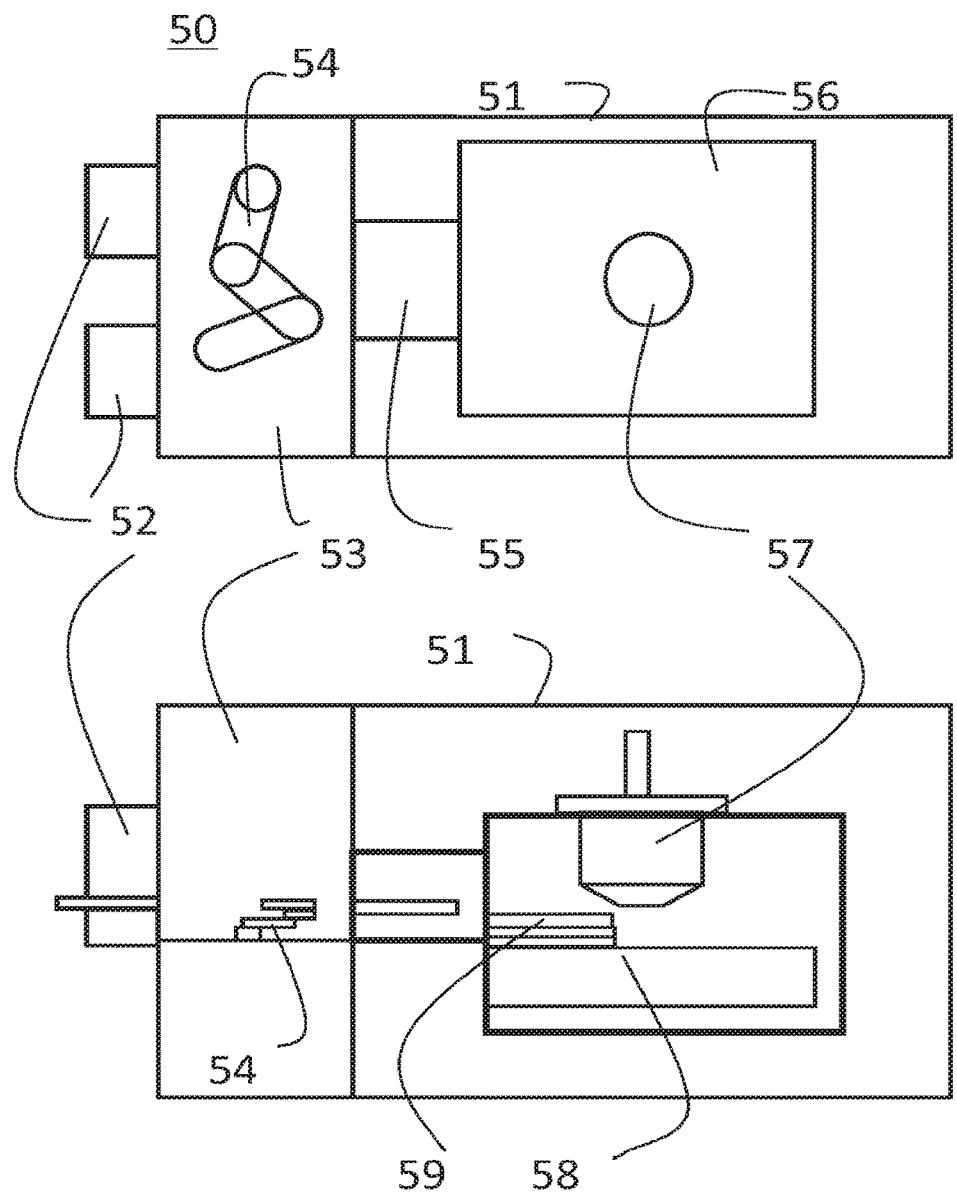
FIGS. 3a and 3b schematically depicts a top view and a side view of an inspection tool according to some embodiments of the disclosure.

FIGS. 3A and 3B schematically depict a top view and a cross-sectional view of an inspection tool 50 according to some embodiments of the present disclosure. Some embodiments comprise an enclosure 51, a pair of load ports 52 serving as an interface to receive objects to be examined and to output objects that have been examined. Some embodiments comprise an object transfer system, referred as an EFEM, equipment front end module 53, that is configured to handle and/or transport the objects to and from the load ports. In some embodiments, the EFEM 53 may comprise a handler robot 54 configured to transport objects between the load ports and a load lock 55 of the EBI system 50. The load lock 55 may be an interface between atmospheric conditions occurring outside the enclosure 51 and in the EFEM and the vacuum conditions occurring in a vacuum chamber 56 of the inspection tool 50. In some embodiments, the vacuum chamber 56 may comprise an electron optics system 57 configured to project an e-beam onto an object to be inspected (e.g., a semiconductor substrate or wafer). The inspection tool 50 may comprise a positioning device 58 that may be configured to displace the object 59 relative to the e-beam generated by the electron optics system 57.

In some embodiments, the positioning device may comprise a cascaded arrangement of multiple positioners such an XY-stage for positioning the object in a substantially horizontal plane, and a Z-stage for positioning the object in the vertical direction.

In some embodiments, the positioning device may comprise a combination of a coarse positioner, configured to provide a coarse positioning of the object over comparatively large distances and a fine positioner, configured to provide a fine positioning of the object over comparatively small distances.

In some embodiments, the positioning device 58 may comprise an object table for holding the object during the inspection process performed by the inspection tool 50. In some embodiments, the object 59 may be clamped onto the object table by means of a clamp such as an electrostatic clamp. Such a clamp may be integrated in the object table.

Figure 4:
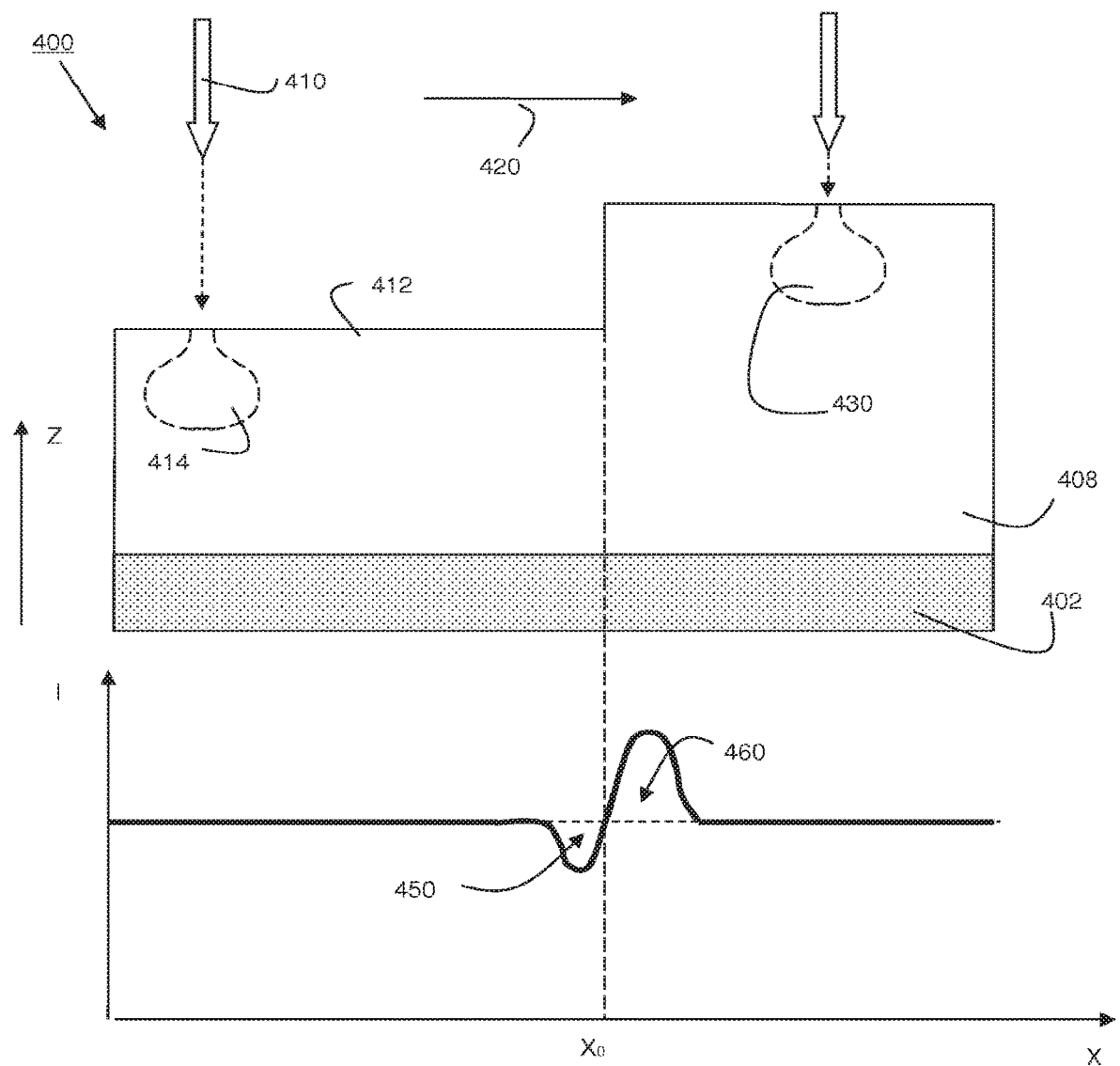
FIGS. 4 and 5 schematically depict cross-sectional views of scanning processes using an electron beam according to some embodiments of the disclosure.
Figure 5:
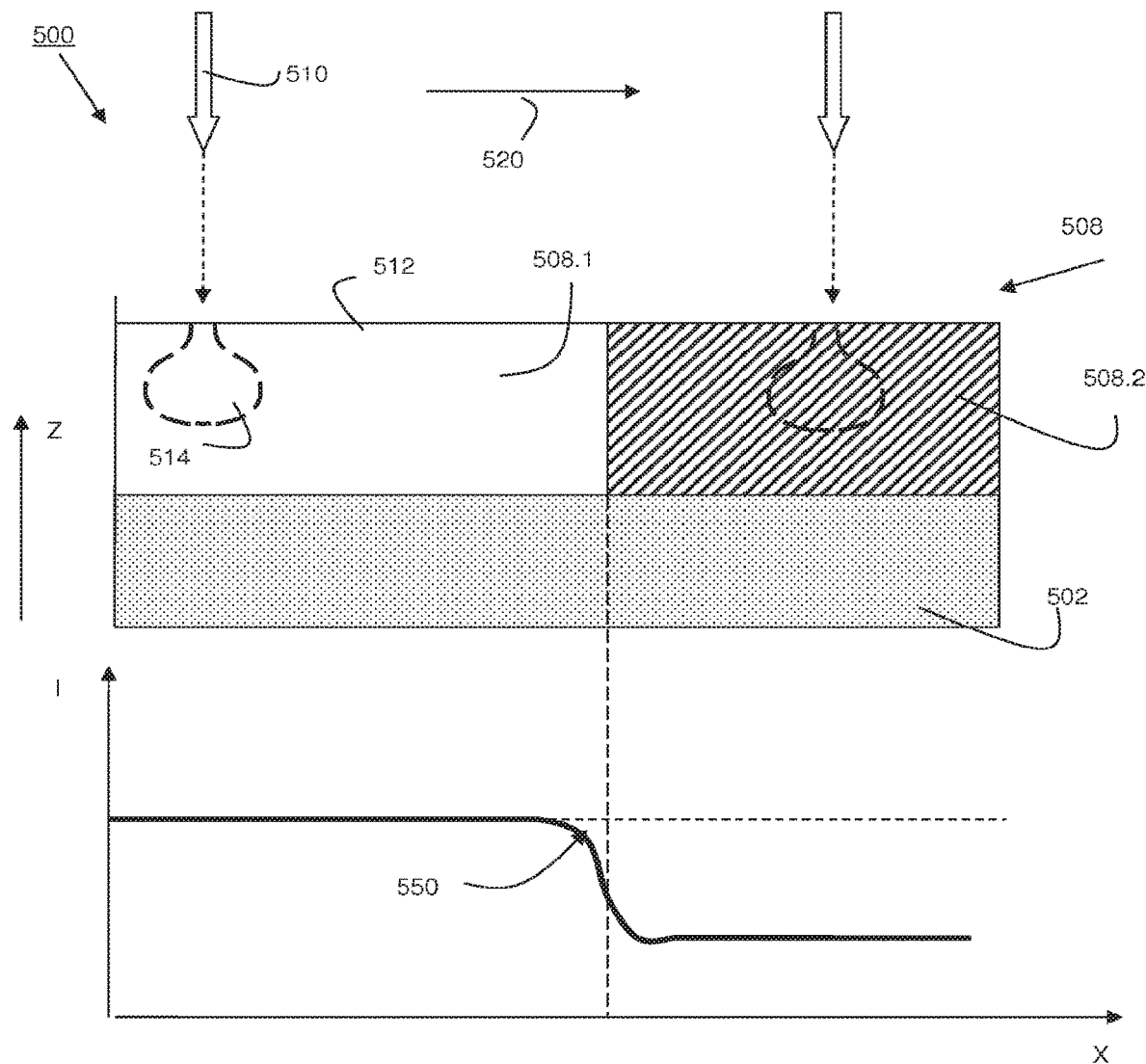

An inspection tool such as a SEM may advantageously be applied to inspect structures, in particular geometric or material characteristics of such structures. This is schematically illustrated in FIGS. 4 and 5. FIG. 4 highly schematically shows a cross-sectional view of a semiconductor structure 400 comprising multiple layers and different materials. The structure 400 as schematically shown in FIG. 4 comprises a bottom layer 402 of a first material, and a top layer 408 of a second material, the second layer having a change in topology, in particular an increased height, when propagating along the X-direction. FIG. 4 further schematically shows an e-beam 410 impinging on the top surface 412 of the structure 400. Indicated by the dotted line 414 is the interaction volume of the e-beam 410 (e.g., the volume where secondary or back-scattering electrons may be generated as a result of the applied e-beam). It should be noted that, while the e-beam may have a diameter of only a few nm, the interaction volume will typically have a larger diameter (e.g., 10-1000 nm) depending on the material properties and landing energy. FIG. 4 further illustrates the scanning of the e-beam (indicated by arrow 420) towards the right, thereby moving the interaction volume 414 along the X-axis. During said scanning, the interaction volume 414 will follow the surface 412 of the sample. As such, during such scanning movement, the interaction volume 414 may be affected by the change in topography (e.g., the height step occurring at position $x=x_0$). As a result, the amount of secondary and/or back-scattering electrons as detected may be affected as well.

The bottom portion of FIG. 4 schematically shows a detector signal I as detected during a scan of the electron beam 410 along the X-direction. As can be seen, when the e-beam 410 is close to the height step, a decrease 450 may occur in the detector signal I, whereas, when the e-beam 410 has passed the height step, a brief increase 460 occurs. As will be appreciated by the skilled person, the occurrence of such a variation of the detector signal I may thus be used to determine a position of a height step in a layer of a sample.

In general, the amount of secondary and/or back-scattering electrons as detected may be affected by topographic changes and by the material properties of the material that is inspected by the electron beam. The latter effect is schematically illustrated in FIG. 5.

FIG. 5 highly schematically shows a cross-sectional view of a semiconductor structure 500 comprising multiple layers and different materials. The structure 500 as schematically shown in FIG. 5 comprises a bottom layer 502 of a first material, and a top layer 508, the left portion of the top layer 508.1 and the right portion of the top layer 508.2 being made of different materials. FIG. 5 further schematically shows an e-beam 510 impinging on the top surface 512 of the structure 500. Indicated by the dotted line 514 is the interaction volume of the e-beam 510 (e.g., the volume where secondary or back-scattering electrons may be generated as a result of the applied e-beam). FIG. 5 further illustrates the scanning of the e-beam (indicated by arrow 520) towards the right, thereby moving the interaction volume 514 along the X-axis. During said scanning, the interaction volume 514 may follow the surface 512 of the sample. As such, during such scanning movement, the interaction volume 514 may be affected by the change in material (e.g., the material transition occurring in the top layer 508 at position $x=x_0$). As a result, the amount of secondary and/or back-scattering electrons as detected may be affected as well.

The bottom portion of FIG. 5 schematically shows a detector signal I as detected during a scan of the electron beam 510 along the X-direction. As can be seen, when the e-beam 510 crosses the material transition (at the position $x=x_0$), the detection signal I decreases and subsequently remains constant again, at a different level. Note that, depending on the materials applied for the layer portions 508.1 and 508.2, an increase in signal I may occur as well.

As illustrated above, the scanning of a structure by a SEM enables to determine both material and topographic transitions occurring on a sample or structure on a sample. Such scanning may thus be used to inspect such a sample and assess whether the required or expected structure, both in terms of topography/geometry and materials, is present.

In accordance with the present disclosure, a SEM based inspection method is presented which enables, in a more accurate manner, a quality assessment of a lithographic process performed on a substrate or sample. Such a lithographic process may, for example, include a process of patterning the substrate, in particular a resist layer provided on the substrate, with a patterned beam of radiation and a subsequent process of developing the patterned resist layer. As a result of such patterning and developing, a particular structure may be expected on the substrate. Using a SEM inspection tool, the actual structure can be determined and compared to the expected structure. The method according to the present disclosure is in particular suited to inspect a structure comprising a top layer (e.g., a resist layer) in which a plurality of openings are made (e.g., by a lithographic exposure process) followed by a development process. Such a process is often applied as a preparation to etch contact holes in a structure or layer underneath the top layer, whereby the etchant is applied via the openings in the top layer.

In order for such etching process to be effective, it is important that the openings in the top layer both have the correct size and are sufficiently deep enough for the etchant to reach the layer into which the contact holes are to be made. Within the meaning of the present disclosure, the latter criterion or parameter may also be quantified by the amount that the opening in the top layer is open at the bottom (e.g., whether or not the opening forms a through hole through the top layer). The latter criterion may therefore also be referred to as the open-state of the opening, where the open-state can range between the opening being entirely open at the bottom and the opening being entirely closed at the bottom.

In order to assess both parameters or criteria, the inspection method according to the present disclosure makes use of a SEM image of the structure comprising the plurality of openings.

Figure 6:
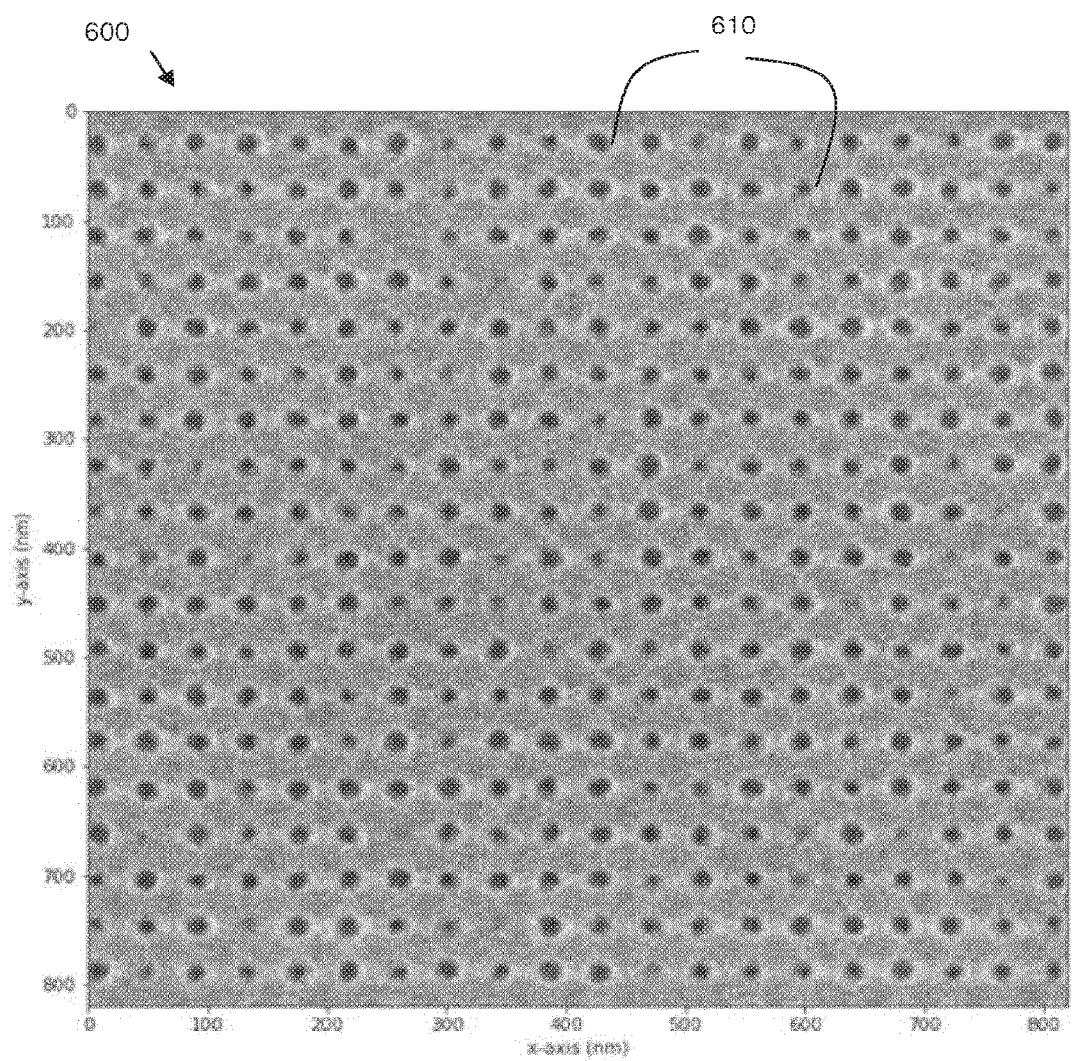
FIG. 6 schematically depicts a SEM image of a structure comprising a plurality of openings according to some embodiments of the disclosure.

Such a SEM image 600 is schematically shown in FIG. 6. FIG. 6 schematically shows a SEM image 600 of a sample comprising a resist layer provided with a plurality of openings. The resist layer as shown in particular may comprise a plurality of poorly developed openings. As a result, the SEM image may comprise a plurality of dark and grey spots 610 of different sizes, the spots indicative for the openings in the resist layer. As can be seen in the SEM image, there may be a large variation in the size of the spots indicating the openings, suggesting a large variation in the diameter of the openings. In addition, a large variation in intensity (represented by the gray-scale value) at the locations of the spots can be observed.

Figure 7:
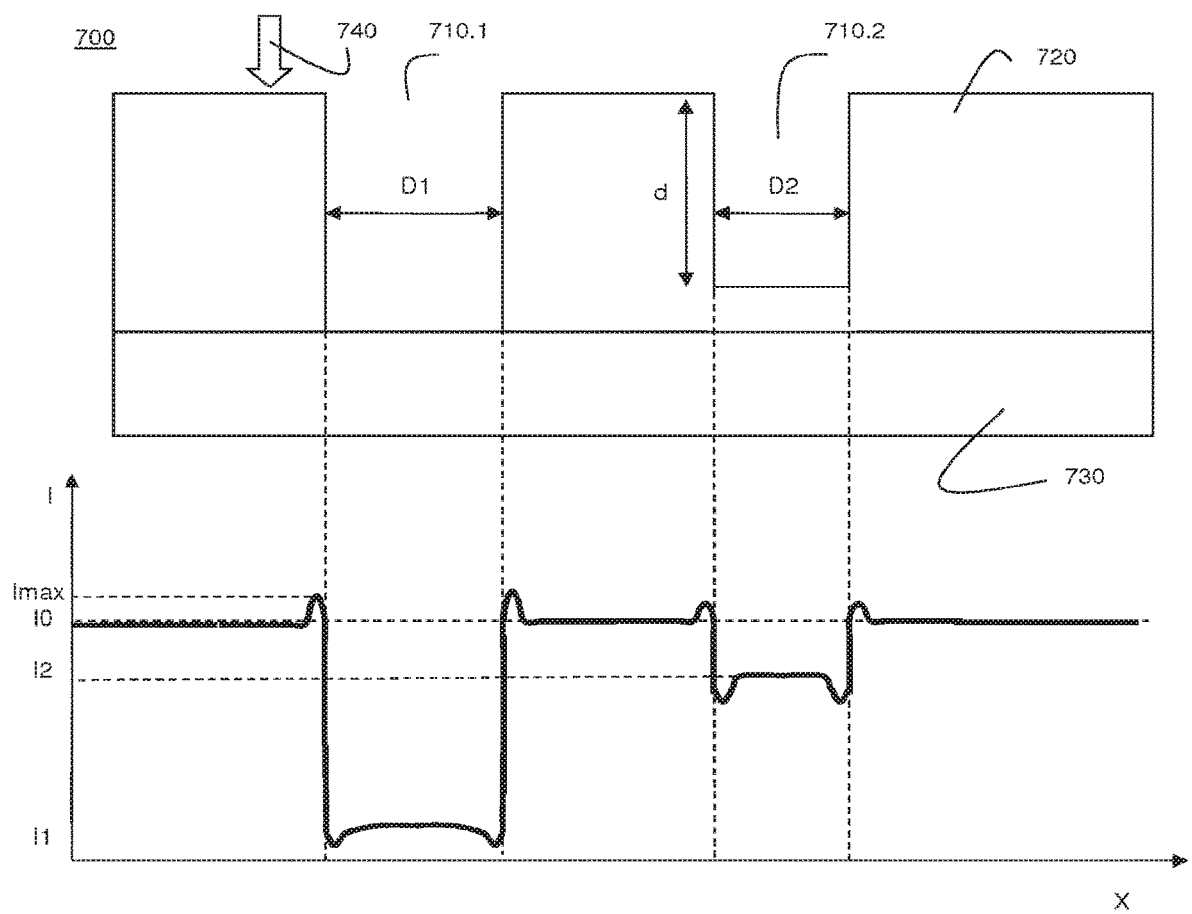
FIG. 7 schematically depicts the scanning of an e-beam across two openings in a layer according to some embodiments of the disclosure.

In order to assess the quality of the openings that are generated in the substrate or sample, the inspection method according to the present disclosure, proposes to use a two-fold criterion (e.g., the evaluation of two parameters) both of which can be evaluated using the SEM image. In particular, both the size of the opening and the open-state of the opening are assessed, based on the SEM image. This is illustrated in FIG. 7. FIG. 7 schematically shows a cross-sectional view of a sample 700, the sample comprising a pair of openings 710.1, 710.2 provided in a layer 720, e.g. a resist layer, that is provided on top of a layer 730 of a semiconductor substrate.

The bottom part of the FIG. 7 schematically shows a detector signal, as a function of position when an electron beam 740 is used to scan the two openings along the X-direction. With respect to the scanned openings, it can be pointed out that both openings have a different diameter (D1 vs. D2) and have a different depth. In particular, the opening 710.1 extends all the way through the layer 720, opening 710.1 may thus also be referred to as a through hole or opening, whereas opening 710.2 does not. As a result, the detector signal as obtained when the first opening 710.1 is scanned may be substantially different from the detector signal obtained when the second opening 710.2 is scanned. In particular, the detector signal I1 as perceived when the center of the first opening 710.1 is probed, will depend on the interaction of the electron beam 740 with the material of the layer 730 of the substrate, whereas the detector signal I2 as perceived when the center of the second opening 710.2 is probed, would primarily depend on the interaction of the electron beam 740 with the material of the layer 720. As a result, there may, in general, be a clear distinction between a detector signal resulting from the probing of a through hole or opening 710.1, compared to a detector signal from the probing of an opening 710.2 which is not completely open. In FIG. 7, the detector signal I=I0 refers to the detected intensity outside the openings 710.1 and 710.2. With respect to the intensity I2 as observed when an opening is scanned that is still closed at the bottom, it can be pointed out that this intensity will vary, depending on the actual depth d of the opening. The smaller the depth d of the opening 710.2, the larger the intensity I2 as measured will be.

As can be seen from the bottom graph of FIG. 7, near the edges of both openings, a slight signal increase I=Imax can be observed. When scanning a structure across an area of interest, one can thus retrieve a two-dimensional intensity map of the area of interest, the area of interest (e.g., comprising a plurality of openings). In cases with a plurality of openings scanned using a SEM as shown, for example, in FIG. 6, an image such as image 600 can be obtained by converting the measured intensities (e.g., the intensity map as captured by a detector of the SEM, into grey-scale values, whereby an intensity level I=I1 may be represented as black while I=Imax may be represented as white).

In some embodiments, of the present disclosure, a SEM image such as SEM image 600 may used to determine various parameters of the structure that is scanned. Such parameters may include dimensions of openings of the structure and an open-state of the openings (e.g., whether or not the openings are actual through holes). Various options exist to determine these parameters, as will be illustrated with reference to FIG. 8.

Figure 8:
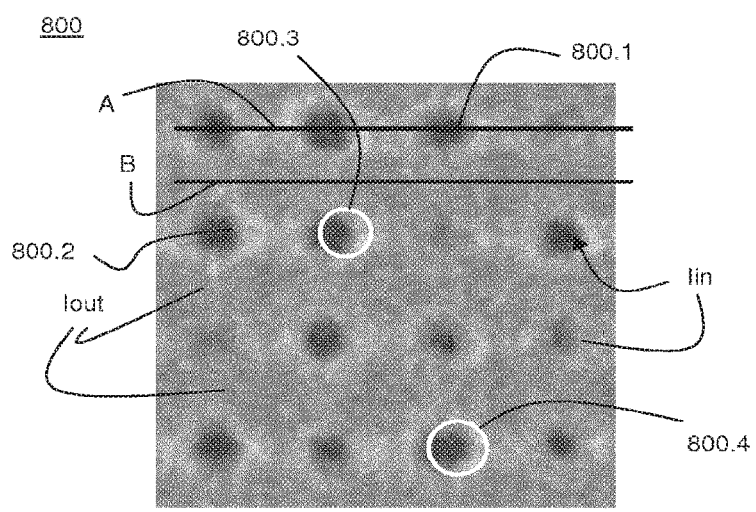
FIG. 8 schematically depicts a detailed view of a SEM image according to some embodiments of the disclosure.

FIG. 8 shows a more detailed view 800 of the SEM image of FIG. 6. FIG. 8 schematically shows a SEM image of a matrix of 4×4 openings in a structure. As will be appreciated by the skilled person, one may determine, either based on the intensity map or the grey-scale values, the locations of the openings in the examined area of interest by means of image processing technique. When observing the intensity variations along lines A and B, one can easily assess that line A crosses the openings, whereas line B crosses an area of the structure where no openings are located. By evaluating the intensity or grey-scale variations along multiple lines (e.g., both horizontal and vertical), one may accurately determine the location of the openings. Based on this, one may then determine the intensity values or grey-scale values Iin inside the openings. These may, for example, correspond to intensity values I1 and I2 shown in FIG. 7, and intensity values or grey-scale values Iout outside the openings (e.g., corresponding to intensity value I0 of FIG. 7).

In some embodiments, the intensity I0 or Iout, for example the intensity or grey-scale value outside the openings, can be determined as an average intensity at different locations outside the openings. The intensity values inside the openings, I1, I2 or Iin, may, for example, be determined as the intensity as measured at the center of the opening or as an average intensity near the center of the opening. Once the intensity Iout outside the openings and the intensities Iin inside the openings are known, one can calculate, for each of the openings, the difference between the intensity outside the opening and the intensity inside the opening. This difference may be referred to as contrast. As such, based on the intensities or grey-scale values of a captured SEM image, one may determine, for each of the openings scanned, a contrast value.

In some embodiments of the present disclosure, this contrast value is used to determine whether or not an opening is a through opening or not. For example, the contrast value can be used to determine the open-state of an opening. In some embodiments, the contrast value of an opening may be used to qualify an opening as a through opening when the contrast value of the opening exceeds a threshold value. A threshold value for the contrast may, for example, be based on a comparison of the contrast of multiple openings. Alternatively, the threshold value may, for example, be based on the highest contrast value determined. With reference to FIGS. 6 and 8, it can be mentioned that the highest contrast value will be observed for those openings that are shown as substantially black, for example openings 800.1 and 800.2 as shown in FIG. 8. Based on the contrast value of these openings, which can be referred to as a maximum contrast value Cmax, one can, for example, determine that in order to qualify as a through opening, the contrast of a opening should be at least 90% of the maximum contrast value Cmax.

As an alternative, the open-state of an opening may, for example, be based on a contrast distribution. Such a contrast distribution may, for example, be obtained by determining the contrast for a plurality of openings that are scanned by a SEM. In some embodiments, the plurality of openings as measured or inspected may be present on the same sample. Alternatively, measurements of different samples, each comprising a plurality of openings, may be combined to determine the contrast distribution. Based on the contrast distribution, one may subsequently determine the open-state of a particular opening. In some embodiments, a curve fitting may be applied to the contrast distribution. As an example of such curve fitting, a Gaussian curve fitting can be mentioned.

Figure 9:
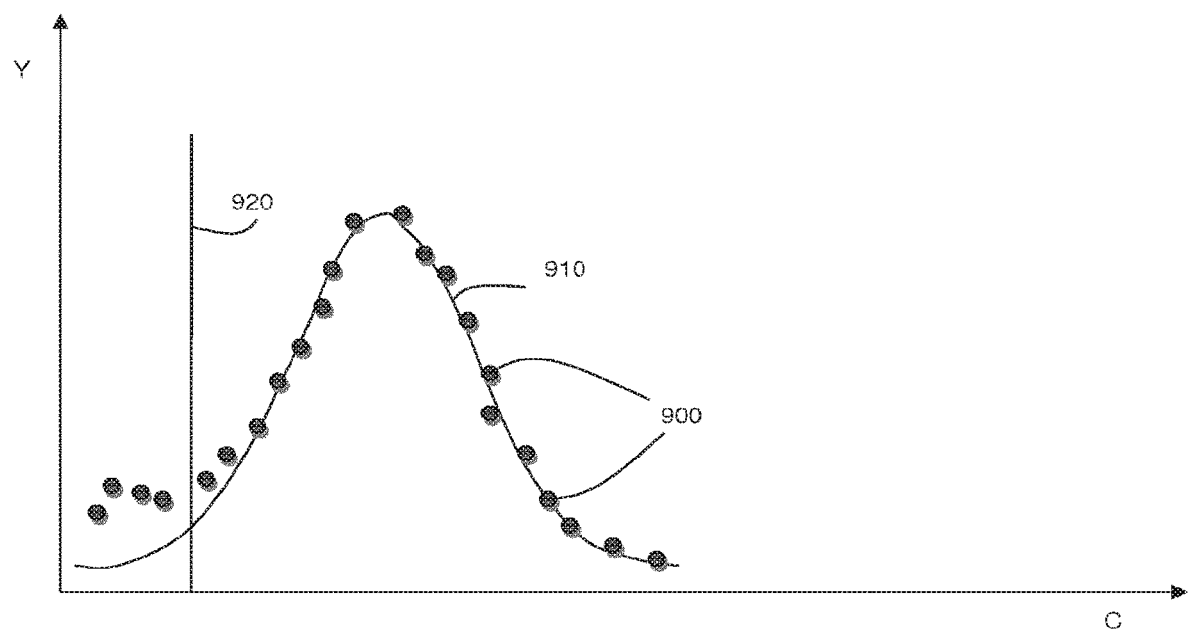
FIG. 9 schematically depicts a contrast distribution of a plurality of openings according to some embodiments of the disclosure.

FIG. 9 schematically shows a contrast distribution 900 as can be obtained when determining the contrast of a plurality of openings, together with a Gaussian curve 910 fitted to it. In the graph of FIG. 9, the contrast C is shown along the horizontal axis, whereas the number of openings Y having a particular contrast is shown along the vertical axis. As can be seen, a substantial portion of the distribution fits rather well to a Gaussian distribution apart for some number of openings with a poor or low contrast. It can be considered highly likely that these openings are insufficiently developed (e.g., they are not through openings). In some embodiments of the present disclosure, a Gaussian curve may be fitted to the contrast distribution and used to qualify an open-state of an opening that has been examined. Such a qualification can, for example, be based on the variance $\sigma$ of the distribution. As an example, line 920 represents the $-3\sigma$ line of the Gaussian distribution 910. Any opening having a contrast value lower than the contrast value of the $-3\sigma$ line may, for example, be considered as flawed (e.g., insufficiently open). It is worth mentioning that the use of the contrast value of the $-3\sigma$ line is merely an example. Alternatively, other values such as the contrast value of the −4.5σ line or −2.5σ line may be considered as well.

In addition to determining the open-state of an opening in a structure that is examined by a SEM, the inspection method according to the present disclosure also includes determining a dimension of the openings, based on the SEM image as obtained.

In some embodiments, the dimension as determined may be the diameter of the opening.

In some embodiments, the diameter of the opening can be determined based on the intensity or grey-scale along a line that crosses the opening. As an example of such a line, reference can be made, for example, to line A as shown in FIG. 8. The intensity along said line would typically vary in a similar manner as the graph shown at the bottom of FIG. 7. As can be seen, near the edges of the opening or openings, the intensity is somewhat elevated (to level Imax), compared to the average or normal intensity outside the openings. A similar effect can be observed in FIG. 8, showing the edge of the openings as somewhat brighter than the area surrounding it. As such, the diameter of the opening may be determined or approximated, based on the positions where an elevated intensity is detected, elevated relative to the intensity in areas outside the openings.

As an alternative, an ellipse fitting algorithm may be applied to the SEM image to determine or estimate the diameter of the openings. Such an ellipse fitting algorithm may, for example, make use of the elevated intensities at the edge of the opening, or the contrast values or intensity values inside the openings. As an example, such an ellipse fitting algorithm may look for a position and diameter of an ellipse, whereby all intensity values within an opening that are below a predetermined threshold are within the ellipse. Alternatively, one can look for an ellipse that encompasses all contrast values that are found within an opening and that are below a predetermined threshold. Circles 800.3 and 800.4 may, for example, be found using any of the above discussed methods.

Once the diameter of the openings has been determined, a quality assessment of the opening, based on the determined geometry, can be performed. In some embodiments, the determined diameter of the openings is compared with an allowable or acceptable diameter range (e.g., when the determined diameter is within the allowable or acceptable range, the dimension of the opening is deemed to be acceptable).

Note that, in a similar manner as discussed above, a quality assessment of the dimension of the opening, in particular the diameter of the opening, can be based on a diameter distribution, obtained by determining the diameter of a plurality of openings. Once such a diameter distribution is obtained, a curve fitting can be applied to it (e.g., a Gaussian curve fitting). Such fitted curve may be used to determine which range of diameters is deemed to be acceptable.

In accordance with the present disclosure, an inspection method is proposed whereby a quality assessment of an opening in a structure (e.g., a resist layer) on a semiconductor substrate or sample, may be made based on a two-fold criterion. In particular, the quality of an opening of the structure is deemed to be acceptable when both the dimension of the opening that is assessed is acceptable and the open-state of the opening is acceptable.

In some embodiments of the inspection method according to the present disclosure, the SEM image may be used to determine both a dimension of an opening and an open-state of the opening.

The inspection method according to the present disclosure may also be embodied in an inspection tool according to the present disclosure. Such an inspection tool may, for example, comprise an object table configured to hold a sample, the sample comprising a structure having a plurality of openings in a top layer of the structure; an e-beam source configured to generate an e-beam; a beam manipulator configured to direct the electron beam onto the sample; a detector configured to detect a response signal of the sample caused by interaction of the electron beam with the sample; and a processing unit configured to receive the response signal from the detector; generate an image of the structure based on the response signal; inspect an opening of the plurality of openings by determining a dimension of the opening based on the image; and determining an open-state of the opening, based on a contrast of the image; and determining a quality of the opening based on both the determined dimension and the determined open-state of the opening.

Using such an inspection tool, substrates that have been processed by a lithographic apparatus and, for example, have been patterned with a plurality of openings in a resist layer that has subsequently been developed may be examined in order to assess the accuracy of the patterning process.

Figure 10:
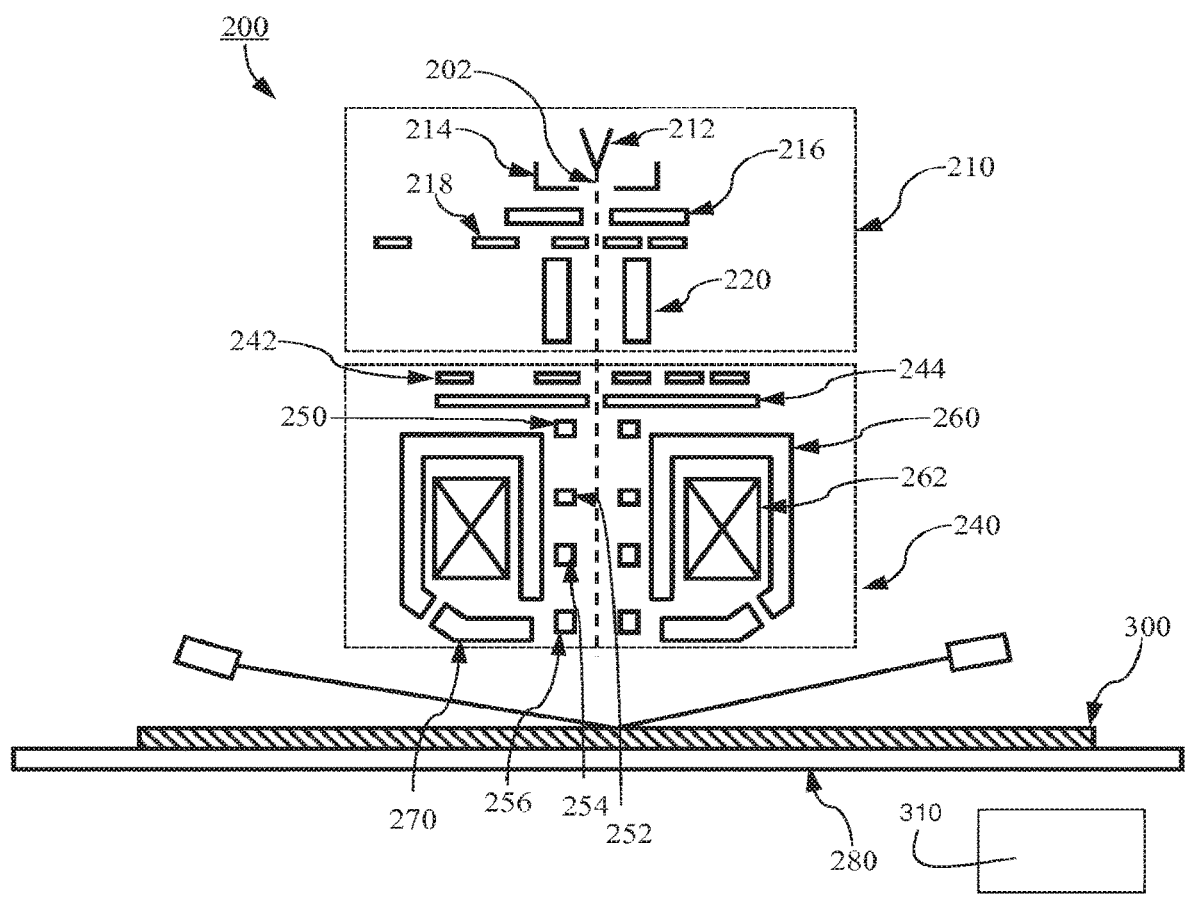
FIG. 10 schematically depicts a more detailed embodiment of an inspection tool according to some embodiments of the disclosure.

FIG. 10 schematically depicts an inspection tool 200 according to some embodiments of the present disclosure, which can be configured to perform the inspection method according to the present disclosure. The inspection tool 200 may comprise an e-beam source, referred to as the electron gun 210 and an imaging system 240.

The electron gun 210 may comprise an electron source 212, a suppressor electrode 214, an anode 216, a set of apertures 218, and a condenser 220. The electron source 212 can be a Schottky emitter or modified Schottky emitter as discussed above. By the positive charge of the anode 216, the electron beam 202 can be extracted, and the electron beam 202 may be controlled by using a tunable aperture 218 which may have different aperture sizes for eliminating the unnecessary electron beam outside of the aperture. In order to condense the electron beam 202, the condenser 220 may be applied to the electron beam 202, which also provides magnification. The condenser 220 shown in the FIG. 10 may, for example, be an electrostatic lens which can condense the electron beam 202. On the other hand, the condenser 220 can be also a magnetic lens.

The imaging system 240 may comprise, for example, a blanker 248, a set of apertures 242, a detector 244, four sets of deflectors 250, 252, 254, and 256, a pair of coils 262, a yoke 260, and an electrode 270. The electrode 270 may be used to retard and deflect the electron beam 202, and may further have an electrostatic lens function. The coil 262 and the yoke 260 may be configured to the magnetic objective lens.

The deflectors 250 and 256 can be applied to scan the electron beam 202 to a large field of view, and the deflectors 252 and 254 can be used for scanning the electron beam 202 to a small field of view. All the deflectors 250, 252, 254, and 256 can control the scanning direction of the electron beam 202. The deflectors 250, 252, 254, and 256 can be electrostatic deflectors or magnetic deflectors. The opening of the yoke 260 may be faced to the sample 300, which immerses the magnetic field into the sample 300. On the other hand, the electrode 270 may be placed beneath the opening of the yoke 260, and therefore the sample 300 may not be damaged. In order to correct a chromatic aberration of the electron beam 202, the retarder 270, the sample 300, and the yoke 260 or part thereof may form a lens to eliminate the chromatic aberration of the electron beam 202. The inspection tool 200 may comprise a processing unit 310, which can, for example, be embodied as a processor, microprocessor, controller, or computer, the processing unit 310 being configured to receive a response signal from the detector or detectors (e.g., detector 244) of the inspection tool and process the response signal into an image of the scanned or examined structure or sample 300. In particular, the processing unit 310 may be configured to, when the scanned or inspected sample is provided with a plurality of openings, inspect an opening of the plurality of openings by determining a dimension of the opening based on the image of the scanned or examined structure; and determining an open-state of the opening, based on a contrast of the image; and determining a quality of the opening based on both the determined dimension and the determined open-state of the opening.

The present disclosure enables to assess the quality of a lithographic process used to generate a plurality of openings in a layer of a semiconductor sample. In accordance with the present disclosure, such an assessment of the quality may be based on an observed contrast in an image of the sample and a dimension of the opening or openings.

Although the disclosure is described above with respect to application by a SEM, the skilled person may appreciate that the disclosure may also advantageously be applied in other types of inspection tools. Examples of such tools that may be mentioned are: charged particle beam tools, X-ray imaging systems, EUV imaging systems, scanning electron microscopes, low-energy electron microscopes, spin-polarized low-energy electron microscopes, or optical inspection tools. Such tools may thus, in accordance with the present disclosure, may be configured to perform the following method of inspecting a semiconductor sample, the sample comprising a structure having a plurality of openings in a top layer of the structure, comprising generating an image of the structure; inspecting an opening or the plurality of openings by determining a dimension of the opening or of the plurality of openings based on the image; and determining a contrast between the top layer and the opening or between the top layer and the plurality of openings; and determining a quality of the opening or the plurality of openings based on both the determined dimension and the determined contrast.

As described above, the use of a two-fold criterion to inspect an opening in a semiconductor sample may enable to may a more accurate assessment of the quality of the openings as obtained using a lithographic processing of the sample.

Some embodiments may further be described using the following clauses:

1. A method of inspecting a semiconductor sample, the sample comprising a structure having a plurality of openings in a top layer of the structure, the method comprising:
   generating an image of the structure using a SEM;
     inspecting an opening or the plurality of openings by:
       determining a dimension of the opening or the plurality of openings based on the image; and
       determining an open-state of the opening or the plurality of openings, based on a contrast of the image;
     determining a quality of the opening or the plurality of openings based on both the determined dimension and the determined open-state.
2. The method according to clause 1, wherein the contrast comprises a difference in intensity observed inside the opening and outside the opening, on the image.
3. The method according to clause 1, wherein the dimension of the opening comprises a diameter of the opening and determining the diameter of the opening comprises applying an ellipse fitting algorithm to the image.
4. The method according to clause 1, wherein the dimension of the opening comprises a diameter of the opening and wherein the diameter of the opening is determined based on an intensity distribution along a line across the image, the line crossing the opening on the image.
5. The method according to any of the preceding clauses, wherein determining an open-state of the opening comprises comparing the contrast of the image with a threshold contrast.
6. The method according to clause 1, wherein the step of determining an open-state of the opening comprises:
   determining, for a plurality of openings, a contrast as a difference in intensity observed inside the opening and outside the opening;
   determining a contrast distribution of the plurality of contrasts obtained for the plurality of openings;
   determining the open-state of the opening based on the distribution.
7. The method according to clause 5, further comprising the step of performing a curve fitting to the contrast distribution and determining the open-state of the opening based on the fitted curve.
8. The method according to any of the preceding clauses, wherein the quality of the opening is deemed acceptable when the determined dimension is within a predetermined range and when the open-state is deemed acceptable.
9. The method according to clause 8, wherein the open-state of the opening is deemed acceptable when a contrast of the opening is within a predetermined range or above a predetermined threshold.
10. Inspection tool comprising:
    an object table configured to hold a sample, the sample comprising a structure having a plurality of openings in a top layer of the structure;
    an e-beam source configured to generate an e-beam;
    a beam manipulator configured to direct the electron beam onto the sample;
    a detector configured to detect a response signal of the sample caused by interaction of the electron beam with the sample;
    a processing unit configured to:
      receive the response signal from the detector;
      generate an image of the structure based on the response signal;
      inspect an opening or the plurality of openings by:
        determining a dimension of the opening based on the image; and
        determining an open-state of the opening, based on a contrast of the image;
        determining a quality of the opening based on both the determined dimension and the determined open-state of the opening.
11. A lithographic apparatus comprising:
    an illumination system configured to condition a radiation beam;
    a support constructed to support a patterning device, the patterning device being capable of imparting the radiation beam with a pattern in its cross-section to form a patterned radiation beam;
    a substrate table constructed to hold a substrate; and
    a projection system configured to project the patterned radiation beam onto a target portion of the substrate, wherein the apparatus further comprises an inspection tool according to clause 10.

12. A method of inspecting a semiconductor sample, the sample comprising a structure having a plurality of openings in a top layer of the structure, the method comprising:
generating an image of the structure;
inspecting an opening or the plurality of openings by:
    determining a dimension of the opening or the plurality of openings based on the image; and
    determining a contrast between the top layer and the opening or between the top layer and the plurality of openings;
determining a quality of the opening or the plurality of openings based on both the determined dimension and the determined contrast.

13. The method according to clause 12, wherein the image of the structure is generated using a charged particle beam tool, an X-ray imaging system, an EUV imaging system, a scanning electron microscope, a low-energy electron microscope, a spin-polarized low-energy electron microscope or an optical inspection tool.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, LCDs, thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the disclosure in the context of optical lithography, it will be appreciated that the disclosure may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist may be cured by applying electromagnetic radiation, heat, pressure or a combination thereof. The patterning device may be moved out of the resist leaving a pattern in it after the resist is cured.

The terms "radiation" and "beam" used herein may encompass all types of electromagnetic radiation, including ultraviolet (UV) radiation (e.g., having a wavelength of or about 365, 248, 193, 157 or 126 nm) and EUV radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the disclosure have been described above, it will be appreciated that the disclosure may be practiced otherwise than as described. For example, the disclosure may take the form of a computer program containing one or more sequences of machine-readable instructions describing a method as disclosed above, or a data storage medium (e.g., semiconductor memory, magnetic or optical disk) having such a computer program stored therein.

The descriptions above are intended to be illustrative, not limiting. Thus, it will be apparent to one skilled in the art that modifications may be made to the disclosure as described without departing from the scope of the claims set out below.

What is claimed is:

1. A method of inspecting a semiconductor sample, the sample comprising a structure having a plurality of openings in a top layer of the structure, the method comprising:
generating an image of the structure using a SEM;
inspecting an opening or the plurality of openings by:
    determining a dimension of the opening or the plurality of openings based on the image; and
    determining an open-state of the opening or the plurality of openings, based on a contrast of the image; and
determining a quality of the opening or the plurality of openings based on both the determined dimension and the determined open-state.

2. The method according to claim 1, wherein the contrast comprises a difference in intensity observed inside the opening and outside the opening, on the image.

3. The method according to claim 1, wherein the dimension of the opening comprises a diameter of the opening and determining the diameter of the opening comprises applying an ellipse fitting algorithm to the image.

4. The method according to claim 1, wherein the dimension of the opening comprises a diameter of the opening and wherein the diameter of the opening is determined based on an intensity distribution along a line across the image, the line crossing the opening on the image.

5. The method according to claim 1, wherein determining an open-state of the opening comprises comparing the contrast of the image with a threshold contrast.

6. The method according to claim 5, further comprising performing a curve fitting to the contrast distribution and determining the open-state of the opening based on the fitted curve.

7. The method according to claim 1, wherein determining an open-state of the opening comprises:
determining, for a plurality of openings, a contrast as a difference in intensity observed inside the opening and outside the opening;
determining a contrast distribution of the plurality of contrasts obtained for the plurality of openings; and
determining the open-state of the opening based on the distribution.

8. The method according to claim 1, wherein the quality of the opening is deemed acceptable when the determined dimension is within a predetermined range and when the open-state is deemed acceptable.

9. The method according to claim 8, wherein the open-state of the opening is deemed acceptable when a contrast of the opening is within a predetermined range or above a predetermined threshold.

10. An inspection tool comprising:
an object table configured to hold a sample, the sample comprising a structure having a plurality of openings in a top layer of the structure;
an electron beam source configured to generate an electron beam;

a beam manipulator configured to direct the electron beam onto the sample;
a detector configured to detect a response signal of the sample caused by interaction of the electron beam with the sample; and
a processing unit configured to:
  receive the response signal from the detector;
  generate an image of the structure based on the response signal; and
  inspect an opening or the plurality of openings by:
    determining a dimension of the opening based on the image; and
    determining an open-state of the opening, based on a contrast of the image; and
    determining a quality of the opening based on both the determined dimension and the determined open-state of the opening.

* * * * *